(12) United States Patent
Nguyen et al.

(10) Patent No.: US 7,510,908 B1
(45) Date of Patent: Mar. 31, 2009

(54) METHOD TO DISPENSE LIGHT BLOCKING MATERIAL FOR WAFER LEVEL CSP

(75) Inventors: Hau Thanh Nguyen, San Jose, CA (US); Nikhil Kelkar, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 417 days.

(21) Appl. No.: 11/050,267

(22) Filed: Feb. 1, 2005

Related U.S. Application Data (62) Division of application No. 10/371,998, filed on Feb. 20, 2003, now abandoned.

(51) Int. Cl.
*H01L 21/00* (2006.01)
(52) U.S. Cl. .................. 438/114; 438/462; 438/465
(58) Field of Classification Search .................. 438/113, 438/114, 462, 465
See application file for complete search history.

(56) References Cited

U.S. PATENT DOCUMENTS

| | | | |
|---|---|---|---|
| 5,700,697 A | | 12/1997 | Dlugokecki |
| 5,863,813 A | * | 1/1999 | Dando .................. 438/114 |
| 6,023,094 A | * | 2/2000 | Kao et al. ............... 257/632 |
| 6,077,757 A | | 6/2000 | Mizuno et al. |

(Continued)

OTHER PUBLICATIONS

Behler, Stephan and Dominik Hartmann, "Comparison of Flux Application Methods for Flip Chip Die Bonding", ESEC, Hinterbergstr.32, CH-6330 Cham, Switzerland, SEMICON Singapore 2001, pp. (A-1)-(A-11).

(Continued)

*Primary Examiner*—Zandra V. Smith
*Assistant Examiner*—Seth Barnes
(74) *Attorney, Agent, or Firm*—Beyer Law Group LLP (57) ABSTRACT

Disclosed is a packaged semiconductor device. The device includes a die with an active surface having a plurality of electrical contacts, a back surface located opposite the active surface, and a plurality of side surfaces. The device also includes a first light blocking protective coating that covers at least a portion of the side surfaces of the die. Also, disclosed is a semiconductor wafer including an active surface and a back surface, the active surface having a multiplicity of electrical contacts. The wafer includes a plurality of channels formed in the active surface of the wafer, the channels being arranged in a grid that effectively divide the wafer into a plurality of dice, each die having a plurality of the electrical contacts; and a light blocking filler material that fills the channels. Further, disclosed is a stamp suitable for applying a light blocking filler material into grooves on a semiconductor wafer. The stamp includes a base plate; and a multiplicity of spaced apart fins arranged in a matrix of lines that define a grid sized to match the spacing of saw streets in an associated semiconductor wafer, each line of the matrix having a series of spaced apart fins. Next, disclosed is a wafer level method of packaging integrated circuits. The wafer level method includes cutting a matrix of channels in a semiconductor wafer; dispensing a light blocking filler material into the channels; and dicing the semiconductor wafer by cutting the wafer along the channels and through the light blocking filler material, wherein the dicing cuts are narrower than the channels such that some of the light blocking filler material covers at least portions of side walls of the dice that are singulated by the dicing operation.

13 Claims, 6 Drawing Sheets

U.S. PATENT DOCUMENTS

| | | |
|---|---|---|
| 6,261,684 B1 | 7/2001 | Takahashi et al. |
| 6,352,881 B1 * | 3/2002 | Nguyen et al. .............. 438/108 |
| 6,531,333 B2 | 3/2003 | Lin et al. |
| 6,545,332 B2 | 4/2003 | Huang |
| 6,607,970 B1 | 8/2003 | Wakabayashi |
| 6,630,661 B1 | 10/2003 | Hoffman |

OTHER PUBLICATIONS

Iscoff, Ron, "Solder Ball Attachment: an equipment overview", http://www.chipscalereview.com/issues/0998/r.iscoffl.htm, Sep. 1998, pp. 1-5.

* cited by examiner

METHOD TO DISPENSE LIGHT BLOCKING MATERIAL FOR WAFER LEVEL CSP

CROSS-REFERENCE TO RELATED APPLICATIONS

This application is a Divisional of U.S. patent application Ser. No. 10/371,998 filed on Feb. 20, 2003 now abandoned which is incorporated herein by reference.

This application is also related to U.S. Pat. No. 6,352,881 and U.S. Pat. No. 6,023,094, the contents of which are hereby incorporated by reference.

FIELD OF THE INVENTION

The present invention relates generally to integrated circuit (IC) packages. More specifically, the present invention relates to wafer level chip scale package (CSP) integrated circuits having a side surface coated with a light blocking material prior to the performance of wafer dicing or die singulation.

BACKGROUND OF THE INVENTION

Figure 1:
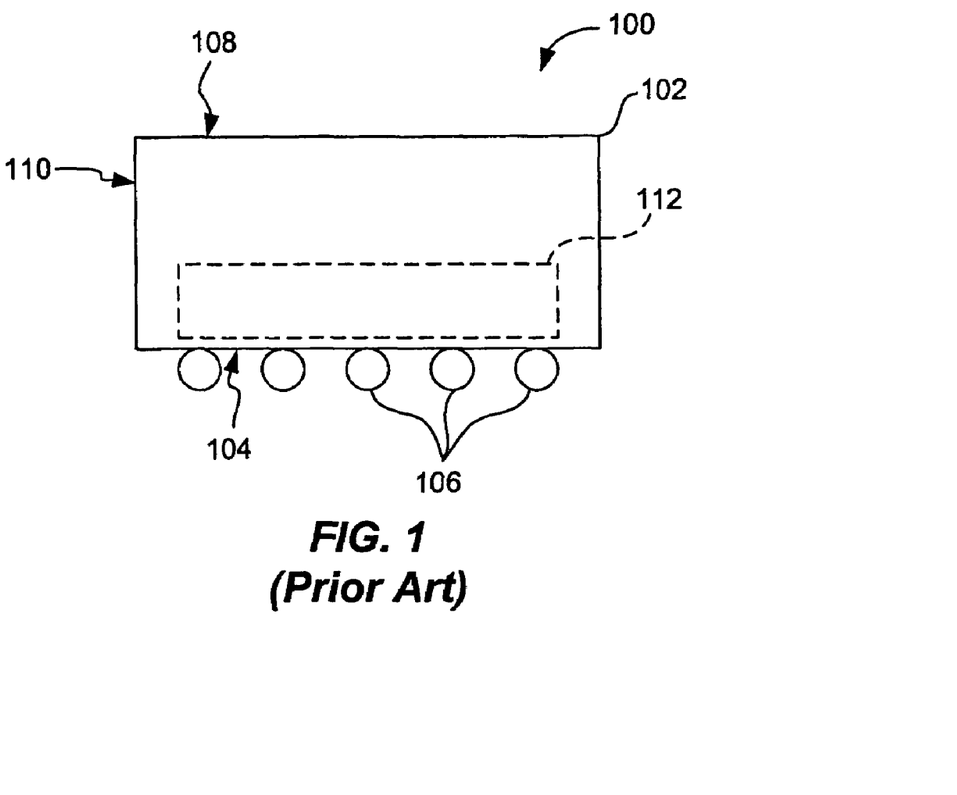
FIG. 1 is a diagrammatic side view of a conventional flip chip type device.

One conventional wafer level CSP style, (commonly referred to as "flip chip" packaging), generally contemplates forming solder bumps (or other suitable contacts) directly on I/O pads (bump pads) formed on an IC die. FIG. 1 is a side view of a conventional flip chip type device. The flip chip 100 includes a die 102 that typically has a plurality of IC device structures in the active region 112. These IC device structures may include, for example, transistors and interconnect layers. The die 102 has a top surface (active surface or frontside) 104 that includes bump pads (not shown). Solder bumps 106 are formed on the bump pads of the top surface 104, which is opposite a bottom surface (backside) 108 of the die 102. In between the top surface 104 and bottom surface 108 are side surfaces 110. A plurality of flip chip dice 102 are typically formed on the surface of a wafer (not shown). After the dice 102 are formed on the wafer, each die 102 is separated from the wafer in a dicing or singulation operation.

Flip chip devices may be mounted in larger package structures or directly on a printed circuit board or other substrate. One problem that has been observed in some flip chip applications is the photo-generation of electrons within the die when a surface of the die is exposed to light. That is, the IC devices may have functional problems due to photogenerated carriers when a surface (e.g., 108, 104, 110) of the die (e.g. 102) is exposed to light, or the IC devices may be subject to an undesirable electrostatic shock during handling of the device subsequent to the dicing operation.

U.S. Pat. Nos. 6,352,881 and 6,023,094, disclose methods of addressing the problem by applying an opaque protective layer to the top surface and/or bottom surface of the flip chip die during wafer processing. That is, the backside and/or frontside of the wafer is coated with a protective film or fill material in order to block any light that may be incident on those respective surfaces. These patents contemplate applying the light blocking materials at the wafer level, which has significant costs advantages when compared to individually coating the dice after the wafer has been singulated.

Although the described wafer level flip chip packaging approaches work quite well, there are continuing efforts to provide further improved wafer level packaging processes and structures that facilitate the use of flip chip packages in even more application.

SUMMARY OF THE INVENTION

To achieve the foregoing and other objects and in accordance with the purpose of the present invention, methods and apparatus for dispensing light blocking material on wafer level CSPs are disclosed. In one aspect of the invention, a light blocking protective coating is applied to side surfaces of dice at the wafer level. With this arrangement, at least a portion of the side surfaces of the singulated dice is covered with the protective coating. In a preferred embodiment, the back side of the wafer is also coated with a light blocking protective layer so that the back sides of the singulated dice are also protected. The light blocking protective coating is generally selected based on the frequency (or wavelength) of light to be blocked, such as infra-red light.

In a method aspect of the invention, after wafer processing has been substantially completed, a plurality of channels are formed in the active surface of the wafer along the saw streets that separate adjacent dice. A light blocking filler material (e.g. an IR light blocking material) is applied to fill the channels. Thereafter, the wafer is diced by cutting the wafer along the channels and through the light blocking filler material. The dicing cuts are arranged to be narrower than the channels such that some of the light blocking filler material covers at least portions of side walls of the dice that are singulated by the dicing operation.

In still another aspect of the invention, a stamp suitable for applying a filler material into grooves on a semiconductor wafer is disclosed. The stamp includes a base plate; and a multiplicity of spaced apart fins arranged in a matrix of lines that define a grid sized to match the spacing of saw streets in an associated semiconductor wafer. Each line of the matrix has a series of spaced apart fins.

BRIEF DESCRIPTION OF THE DRAWINGS

The features of the present invention may best be understood by reference to the following description of the presently preferred embodiments together with the accompanying drawings. For the sake of clarity the drawings are not to scale.

DETAILED DESCRIPTION OF THE INVENTION

The present invention will now be described in detail with reference to a few specific embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

In general, the present invention relates to wafer level arrangements for coating side surfaces of a die with a light blocking material. In one embodiment, the present invention provides a manufacturing methodology in which a dispenser in the form of a stamp is employed and configured to dispense a proper amount of light blocking material into corresponding channels formed in the surface of a semiconductor wafer. Therefore, upon wafer singulation, a die with at least some portions of its side surfaces coated with light blocking material is produced. Although the following description is in reference to flip chip devices, of course, it should be well understood to those skilled in the art that the present invention is not limited to flip chip devices, but may be implemented on any device that has exposed side surfaces during the dicing process, such as a flash memory device or a CSP.

Figure 2:
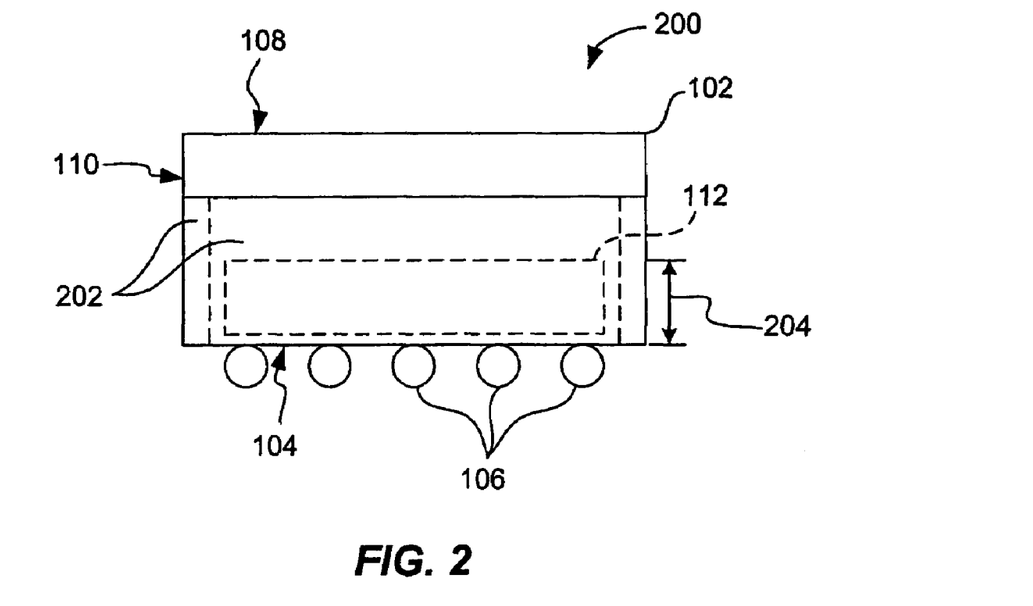
FIG. 2 is a diagrammatic side view of a flip chip device in accordance with one embodiment of the present invention.

Referring to FIG. 2, a diagrammatic side view of a flip chip device 200 in accordance with one embodiment of the present invention is provided. The flip chip 200 includes a die 102 that typically has a plurality of IC device structures in the active region 112. The active region 112 usually resides in a location within the die 102 closer to the top surface 104 than to the bottom surface 108. These IC device structures may include, for example, transistors and interconnect layers. The die 102 has a top surface (active surface or frontside) 104 that includes bump pads (not shown). Solder bumps 106 are formed on the bump pads of the top surface 104, which is opposite a bottom surface (backside) 108 of the die 102. In between the top surface 104 and bottom surface 108 are side surfaces 110. In a specific embodiment, a portion of the side surfaces 110 is coated with a light blocking material 202. A wide variety of materials (e.g., epoxy) may be used as the light blocking material 202. For example, some materials work well in blocking infra-red light or electromagnetic radiation at other frequencies of interest. Some materials also work well in blocking just a single frequency (or wavelength) of light or even several frequencies (or wavelengths) of light. Light blocking material 202 could even be either opaque or transparent in nature. Generally, the light blocking material 202 will be selected based on the light frequency (or wavelength) to be blocked. By way of example, the light blocking material may be chosen to block infra-red (IR) light.

The light blocking material 202 may extend anywhere along a selective number of side surfaces 110 of the die 102. In one specific embodiment, the light blocking material 202 extends along all the side surfaces 110 starting from the edge of the top surface 104 towards the bottom surface 108 to a distance of at least the depth of where the active region 112 extends (e.g., 204).

Figure 3:
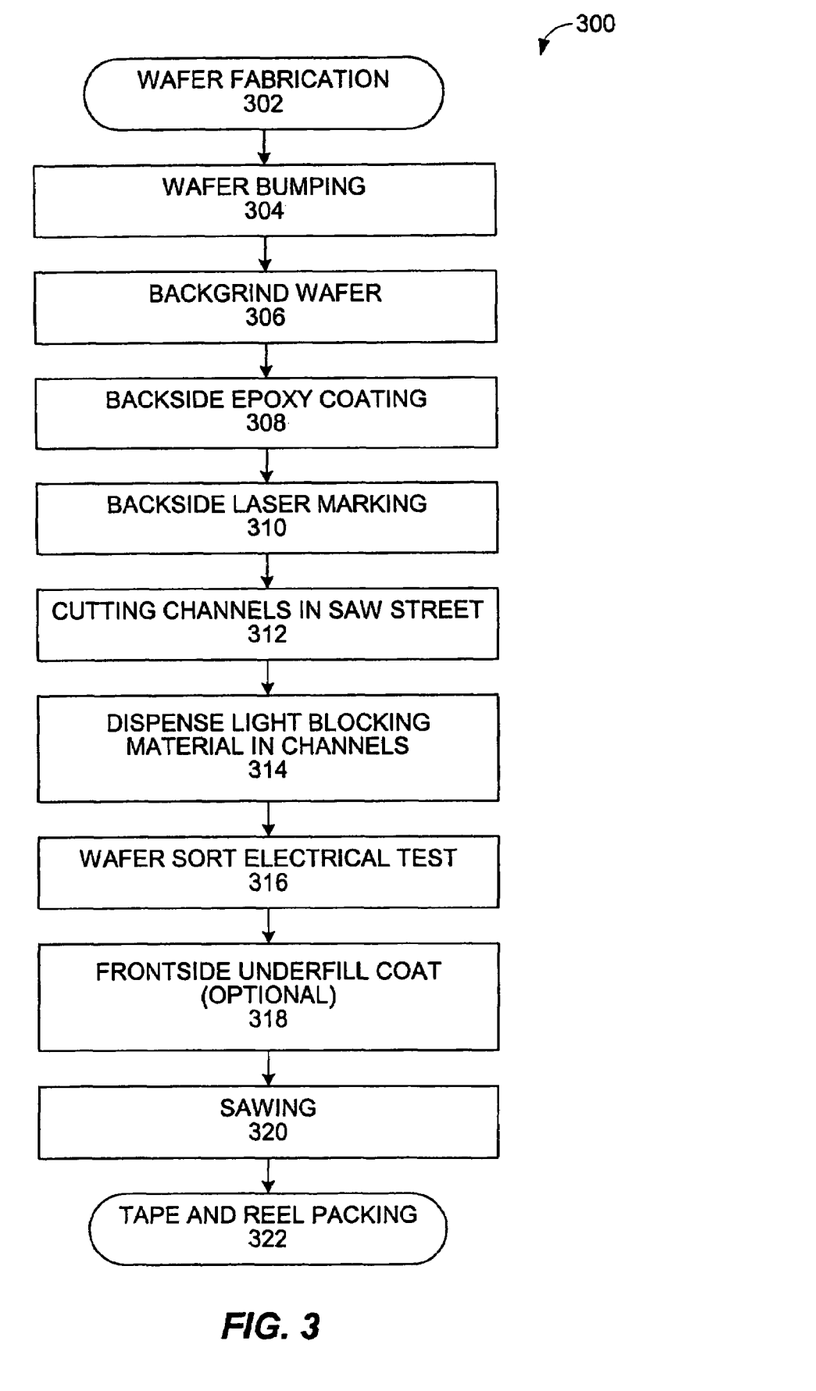
FIG. 3 is a process flowchart illustrating the process of fabricating a flip chip device in accordance with one embodiment of the present invention.

To further understand the present invention, FIG. 3 provides a process flow chart 300 illustrating a process of fabricating a flip chip device in accordance with one embodiment of the present invention. The flow chart 300 begins generally with conventional wafer fabrication that is illustrated in step 302. Next, conventional wafer bumping may be performed as illustrated in step 304. Then the process of backgrinding the wafer is done in step 306 (if necessary) followed by backside epoxy coating and backside laser marking in steps 308 and 310 respectively. In a specific embodiment, channels are cut in the top side of the wafer along the saw streets in step 312. Once the channels have been formed in step 312, light blocking material is dispensed into the channels in step 314. After the light blocking material has set, appropriate testing, such as wafer sort electrical testing shown in step 316 may be performed. An optional frontside underfill coat may also be performed in step 318. Then sawing in step 320. That is, the dice are singulated. Next, tape and reel packing in step 322 is done to complete the flow chart 300. As will be appreciated by those skilled in the art, in many situations, the order of the various described steps may be altered and some of the steps eliminated and/or other steps added. The steps that are particularly relevant to the present invention, in particular steps 312 and 314, will be discussed further in detail throughout the detailed description.

Figure 4A:
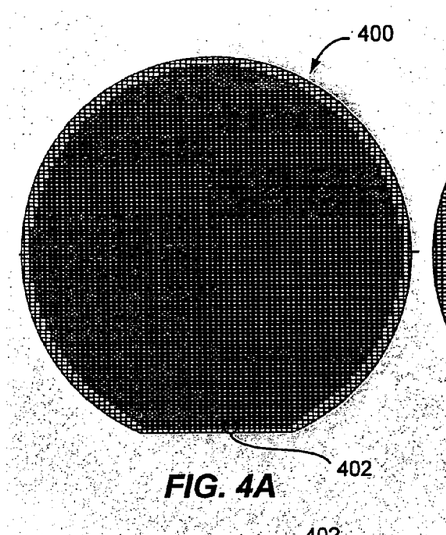
FIG. 4A is a diagrammatic top view of a partially sawn wafer in accordance with one embodiment of the present invention.
Figure 4B:
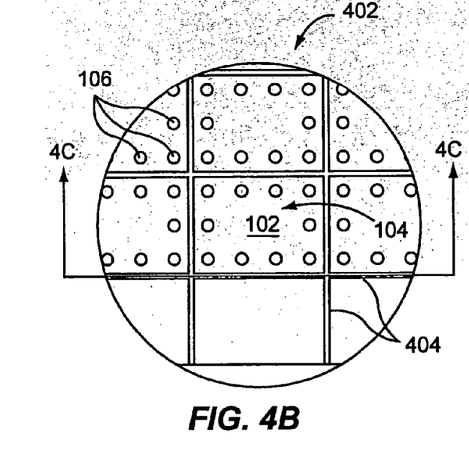
FIG. 4B is a diagrammatic enlarged top view of a portion of the partially sawn wafer as designated in FIG. 4A.
Figure 4C:
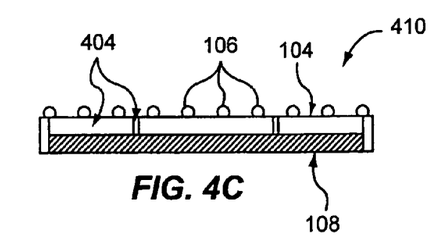
FIG. 4C is a diagrammatic sectional view of the portion of the partially sawn wafer in FIG. 4B along line 4C-4C.

FIGS. 4A, 4B, and 4C are diagrammatic drawings illustrating a partially sawn wafer 400 in accordance with one embodiment of the present invention. First, FIG. 4A is a diagrammatic top view of a partially sawn wafer 400. The partially sawn wafer 400 includes a plurality of dice 102 that form the basis for the flip chip 200 of FIG. 2. An enlarged top view portion 402, as shown in FIG. 4B, of the partially sawn wafer 400 illustrates that the dice 102 are arranged in an array pattern with their top surface 104 (active surface or frontside) in view. The top surface 104 is populated with solder bumps 106. Channels 404 on the surface of the partially sawn wafer 400 separate each die 102. The channels 404 generally correspond to the saw streets used for facilitating the singulation process. Further, the channels 404 act as reservoirs for the light blocking material 202. According to a specific embodiment, channels are formed by partially sawing a wafer along the saw streets as in step 312. That is, using available sawing tools, channels are formed by not completely cutting through the wafer. Without interfering with the functionality of the IC structures within the die 102, each channel's width is wider than the width of the wafer saw used for the dicing operation in step 320. The depth of the channels, on the other hand, may be of any depth from a surface (e.g. top surface or bottom surface) of the wafer. However, the depth is usually at least as deep as the depth that the active region 112 extends to within a die 102. According to another embodiment, the depth is about 200 μm from the top surface 104 of the die 102. Finally, FIG. 4C is a diagrammatic sectional view 410 of the portion 402 of the partially sawn wafer 400 in FIG. 4B along line 4C-4C. The section view 410 illustrates the voided space that is defined by the channels 404. Once again, solder balls 106 are shown on the top surfaces 104 that are opposite from the bottom surfaces 108 of the plurality of dice 102.

Figure 5A:
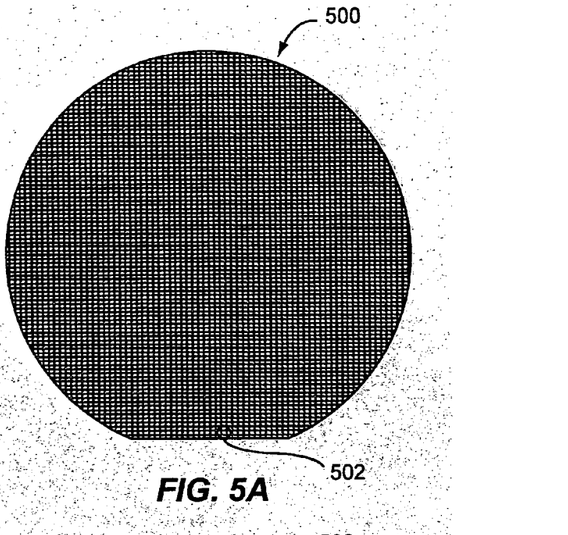
FIG. 5A is a diagrammatic top view of a transfer stamp in accordance with one embodiment of the present invention.
Figure 5B:
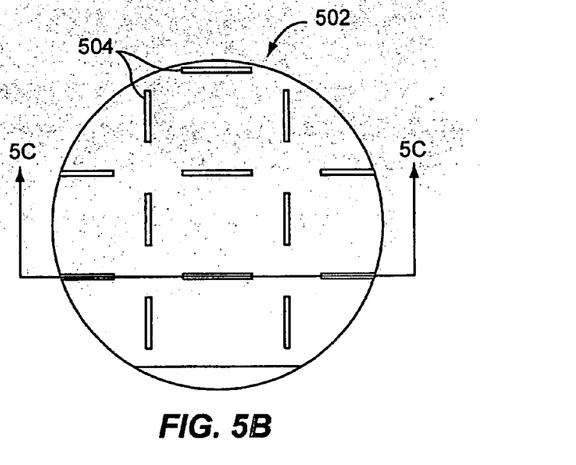
FIG. 5B is a diagrammatic enlarged top view of a portion of the transfer stamp in as designated in FIG. 5A.
Figure 5C:
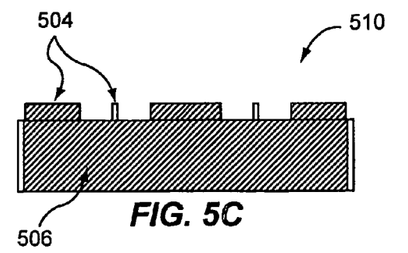
FIG. 5C is a diagrammatic sectional view of the portion of the transfer stamp in FIG. 5B along line 5C-5C.

FIGS. 5A, 5B, and 5C are diagrammatic drawings illustrating a transfer stamp 500 in accordance with one embodiment of the present invention. First, FIG. 5A is a diagrammatic top view of a transfer stamp 500. The transfer stamp 500 will be used to dispense a light blocking material 202 (e.g., epoxy or other suitable materials) into the channels 404 of the corresponding partially sawn wafer 400 of FIG. 4A. An enlarged top view portion 502, as shown in FIG. 5B, of the transfer stamp 500 illustrates that fins 504 (or ridges) are arranged in an array pattern that corresponds to the channels 404. The fins 504 are generally narrower in width than the channels 404. In a specific embodiment, the tips of the fins 504 are narrower than the width of the corresponding channels 404. Furthermore, the fins 504 are sized to dispense an appropriate amount of light blocking material 202 into the channels 404 such that the possibility of overfilling the channels 404 is prevented. That is, the volume of light blocking material 202 dispensed by the fins 504 should not exceed the volume of the voided space that is defined by the channels 404. Therefore, although the fins 504 shown in FIG. 5B are short intermittent sections of the corresponding channels 404, the fins 504 may in fact be continuous sections that mirror the corresponding channels 404 provided that they are sized appropriately as mentioned above. Finally, FIG. 5C is a diagrammatic sectional view 510 of the portion 502 of the transfer stamp 500 in FIG. 5B along line 5C-5C. The section view 510 illustrates the protruding fins 504 from the transfer stamp base 506. The fins 504 may be made from any material. According to a specific embodiment, the fins 504 are made from plastic polymers in order to minimize to possibility of damaging the partially sawn wafer 400 in case they come into contact with each other during the dispensing of the light blocking material 202. The transfer stamp base 506 is typically made from metal to allow sufficient support of the fins 504 and to increase the durability of the transfer stamp 500.

Figure 6A:
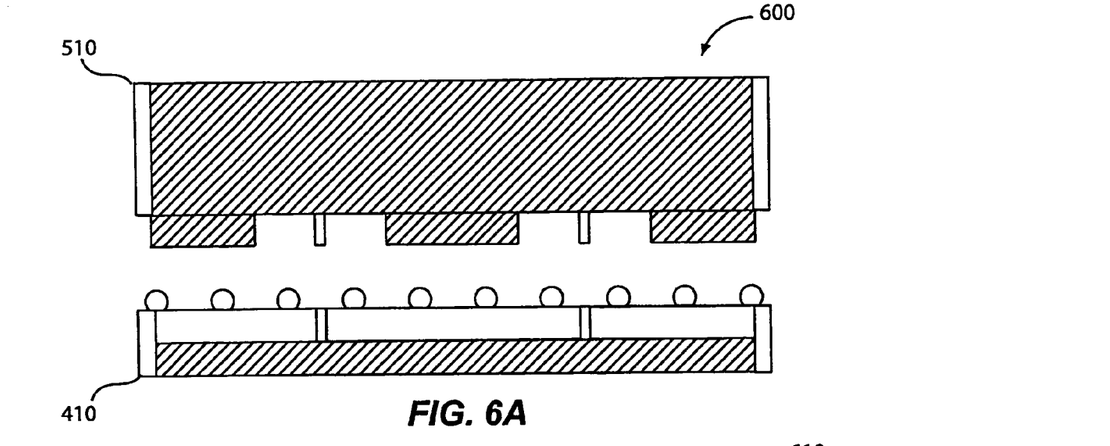
FIG. 6A illustrates the transfer stamp of FIG. 5C aligned over the partially sawn wafer of FIG. 4C in accordance with one embodiment of the present invention.
Figure 6B:
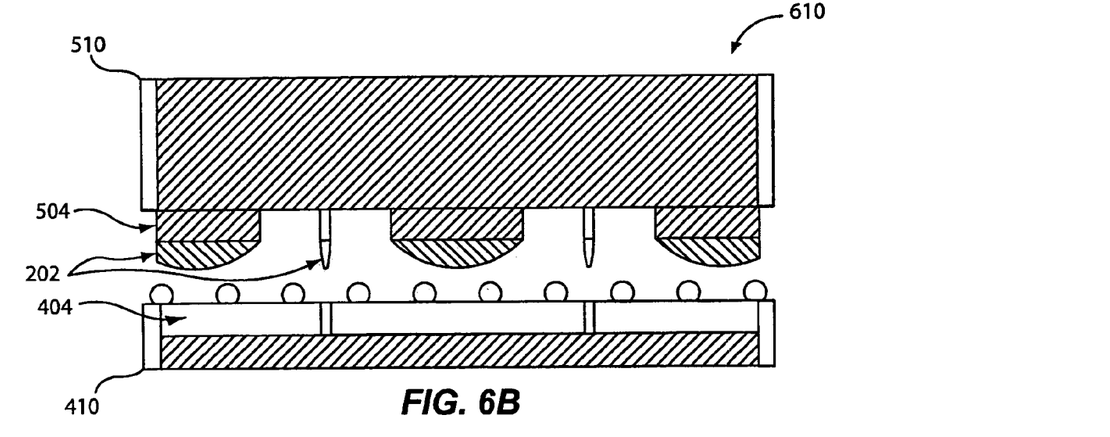
FIG. 6B illustrates the transfer stamp of FIG. 5C with light blocking filling material aligned over the partially sawn wafer of FIG. 4C in accordance with one embodiment of the present invention.
Figure 6C:
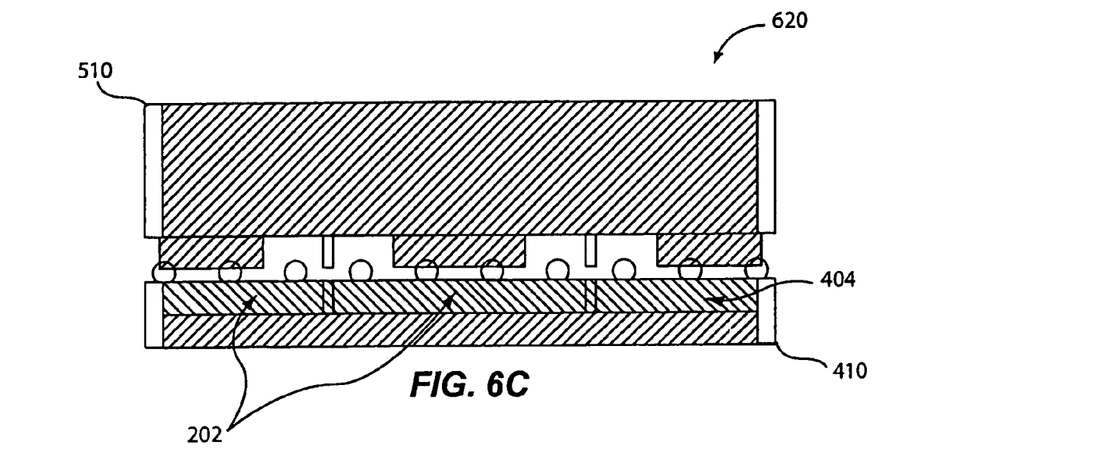
FIG. 6C illustrates the transfer stamp of FIG. 5C having dispensed a light blocking filling material into channels of the aligned partially sawn wafer of FIG. 4C in accordance with one embodiment of the present invention.

As included in step 314, FIGS. 6A, 6B, and 6C show diagrammatic sectional drawings that illustrate the dispensing of a light blocking material 202 from the transfer stamp 500 into the channels 404 of the corresponding partially sawn wafer 400 in accordance with one embodiment of the present invention. First, FIG. 6A is a drawing 600 that illustrates the transfer stamp section view 510 of FIG. 5C aligned over the partially sawn wafer section view 410 of FIG. 4C without any light blocking material 202. Next, FIG. 6B is a drawing 610 that illustrates the transfer stamp section view 510 with light blocking material 202 aligned over the partially sawn wafer section view 410. The light blocking material 202 may be applied onto the fins 504 in various ways. In a specific embodiment, the transfer stamp 500 is placed over a dipping pan, which is filled with light blocking material 202, so that the fins 504 are effectively dipped to allow a known volume of light blocking material 202 to be removed by the fins 504. Depending on the nature of the light blocking material 202 used, icicle-like formations may appear on the tips of the fins 504. For example, if light blocking material 202 in liquid form is used, it is likely that the light blocking material 202 accumulates more at the center and less at the ends of the fins 504 as shown in FIG. 6B. Once the light blocking material is applied to the fins 504, the transfer stamp 500 is placed over the partially sawn wafer 400 such that the fins 504 are aligned as shown in FIG. 6B with the corresponding channels 404. That is, the fins 504 will be placed in a position above the corresponding channels 404 where the light blocking material 202 may effectively dispense into the channels 404. The usage of cameras may aid in facilitating the alignment procedure. According to a specific embodiment, a capillary action of the light blocking material 202 into the channels 404 occurs and continues until the channels 404 are filled. This has the advantage of substantially eliminating air pockets formed within the light blocking material 202, which is more likely when continuous ridges are used to apply the light blocking material in place of the fins 504. Finally, FIG. 6C is a drawing 620 that illustrates the transfer stamp section 510 having dispensed a light blocking material 202 into the channels 404 of the aligned partially sawn wafer section 410. As shown, the voided space as defined by the channels 404 is filled with the light blocking material 202.

Figure 7:
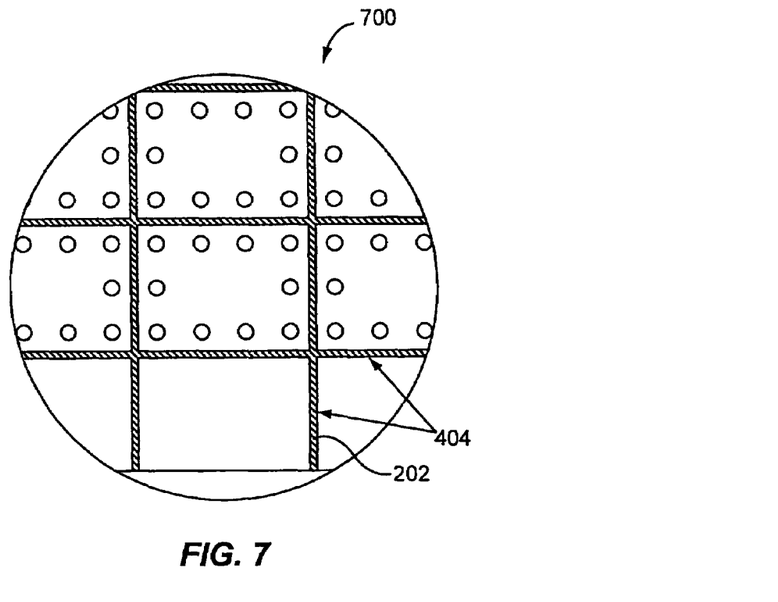
FIG. 7 illustrates the partially sawn wafer of FIG. 4B with light blocking filling material attached to the channels in accordance with one embodiment of the present invention.
Figure 8:
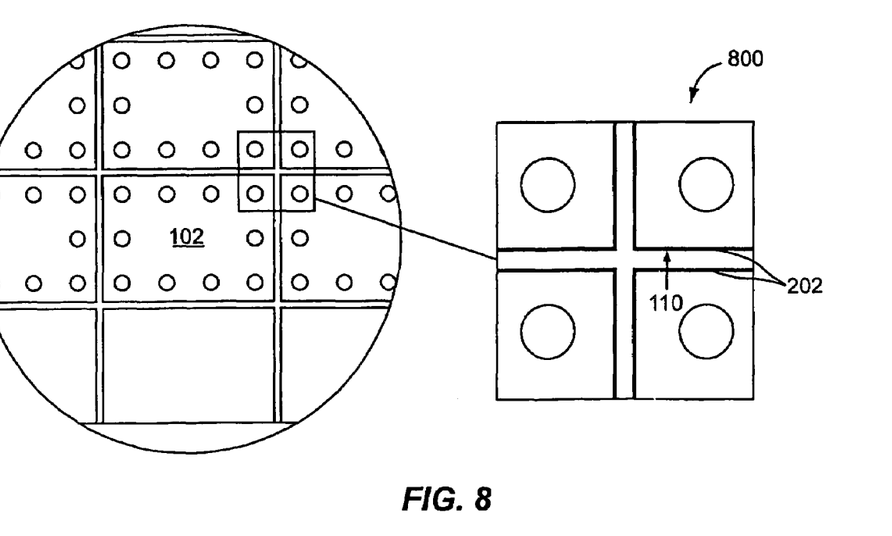
FIG. 8 illustrates singulated coated flip chip devices for the enlarged top view of FIG. 4B in accordance with one embodiment of the present invention.

FIG. 7 illustrates a drawing 700 of the enlarged top view portion 402 of the partially sawn wafer 400 in FIG. 4B with light blocking material 202 attached to the channels 404 in accordance with one embodiment of the present invention. The light blocking material 202 may attach to the channels 404 in various ways. According to a specific embodiment, the light blocking material 202 is allowed to cure so that it can bond with the surfaces defining the channels 404. Moreover, the curing allows the light blocking material 202 to harden. Once the light blocking material 202 attaches to the channels 404 in step 314 and the dice 102 are ready for singulation, the sawing process of step 320 is performed. In some cases, the dice 102 are singulated by using a wafer saw, in other cases, laser tools could be used. To elaborate further, FIG. 8 illustrates a drawing 800 of singulated dice 102 for the enlarged top view portion 402 of FIG. 4B in accordance with one embodiment of the present invention. A portion of the side surfaces 110 of each die 102 that forms a flip chip 200 is coated with a light blocking material 202. A wafer saw is used to cut along the light blocking material 202 filled channels 404 of FIG. 7 that usually correspond to saw streets. According to a specific embodiment, the wafer saw cuts (e.g. wafer saw blade width) are narrower in width than the widths of the channels 202 themselves; thus, allowing portions of the light blocking material 202 to be left behind on the side surfaces 110 of each die 102. Once the singulation process is completed, a singulated coated die 102 as shown in FIG. 8 is provided.

Figure 9:
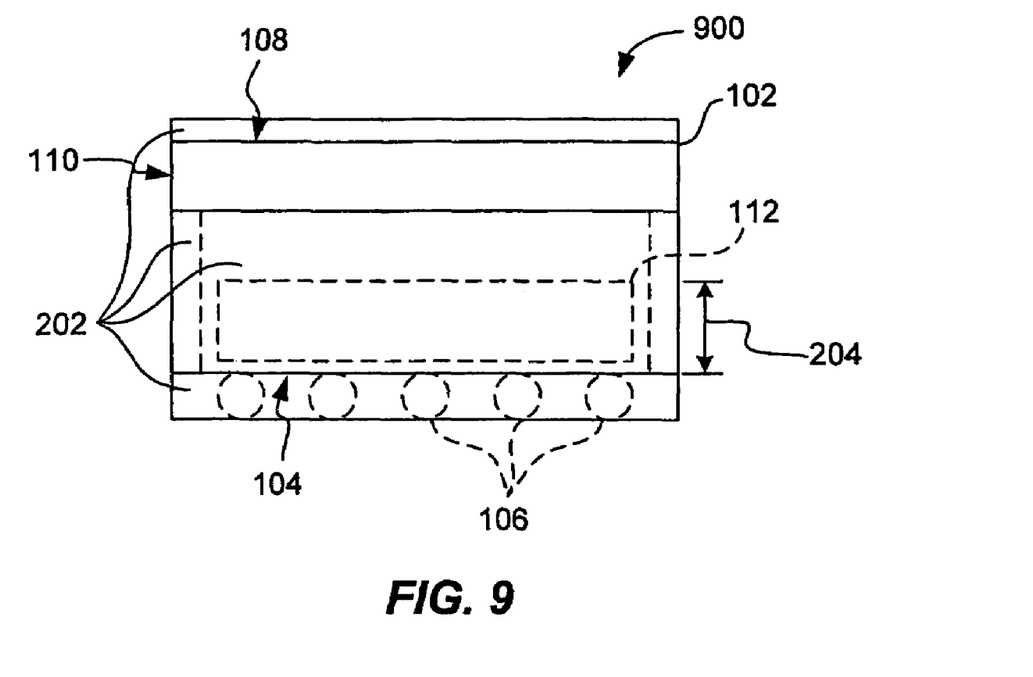
FIG. 9 is a diagrammatic side view of a flip chip device in accordance with another embodiment of the present invention.

FIG. 9 is a diagrammatic side view of a flip chip 900 in accordance with another embodiment of the present invention. The flip chip 900 includes a die 102 that typically has a plurality of IC device structures in the active region 112. The active region 112 usually resides in a location within the die 102 closer to the top surface 104 than to the bottom surface 108. These IC device structures may include, for example, transistors and interconnect layers. The die 102 has a top surface (active surface or frontside) 104 that includes bump pads (not shown). Solder bumps 106 are formed on the bump pads of the top surface 104, which is opposite a bottom surface (backside) 108 of the die 102. In between the top surface 104 and bottom surface 108 are side surfaces 110. The bottom surface and the side surfaces are generally made from silicon. In a specific embodiment, a portion of the side surfaces 110 is made from a light blocking material 202. The selection of light blocking material 202 is dependent on the light frequency to be blocked. The light blocking material 202 may extend anywhere along a selective number of side surfaces 110 of the die 102. However, according to a specific embodiment, the light blocking material 202 extends along all the side surfaces 110 starting from the edge of the top surface 104 towards the bottom surface 108 to a distance of at least the depth of where the active region 112 extends (e.g., 204). The flip chip 900 also includes light blocking material 202 on the top surface 104 of the die 102 without completely encapsulating the solder bumps 106 thereon. That is, areas of the solder bumps 106 are left uncovered to allow it to be coupled to an end device, such as a printed circuit board (PCB). Furthermore, light blocking material 202 is provided on the bottom surface 108 of the die 102.

The present invention provides a number of advantages. For example, the light blocking material 202 on the side surfaces 110 minimizes IC functionality problems if a die 102 is otherwise exposed to light. Additionally, the light blocking material 202 provides mechanical protection and reduces the likelihood of damage to the die during handling. Since sawing debris is often present during wafer singulation, the light block material 202 on the side surfaces 110 of a die 102 protects the die 102 from being scratched if debris gets between the saw blade and the die cutting surface. The light blocking material 202 also provides electrostatic protection, for example, during handling of the devices.

Besides reducing IC functionality problems, the present invention has other advantages. By way of example, the methods and apparatus to dispense the light blocking material 202 provides an efficient and cost effective implementation for use with wafer level CSP integrated circuits. As integrated circuits have become smaller in size, the number of dice on a wafer has accordingly increased. A typical 200 mm wafer may contain as many as 40 thousand dice. Assuming that each die is 1 mm in width by 1 mm length, there would be approximately 100 columns and 100 rows of channels 404 across a 200 mm wafer. The present invention allows the ability to quickly and effectively accommodate the accuracy and high throughput needed to apply a light blocking material onto the sides of a die at the wafer level.

Although only a few embodiments of the present invention have been described in detail, it should be understood that the present invention may be embodied in many other specific forms without departing from the spirit or scope of the invention. For example, the light blocking material 202 may be applied to side surfaces of a bare die as well as a packaged die at the wafer level. Moreover, the light blocking material 202 may be of any form (e.g. a liquid or a solid). Additionally, steps 312 and 314 may be rearranged to come before step 306 in the flow chart 300. Therefore, the present examples are to be considered as illustrative and not restrictive, and the invention is not to be limited to the details given herein but may be modified within the scope of the appended claims.

What is claimed is:

1. A wafer level method of packaging integrated circuits comprising:
    cutting a matrix of channels in a semiconductor wafer;
    dispensing a light blocking filler material into the channels; and
    dicing the semiconductor wafer by cutting the wafer along the channels and through the light blocking filler material, wherein the dicing cuts are narrower than the channels such that some of the light blocking filler material covers at least portions of side walls of the dice that are singulated by the dicing operation, wherein dispensing the light blocking filler material in the channels comprises:
    applying the light blocking filler material to a stamp having a multiplicity of dispensing fins; and
    aligning the stamp over the semiconductor wafer such that the multiplicity of dispensing fins is aligned with the channels, thereby allowing the light blocking filler material to dispense into the channels.

2. The method as recited in claim 1, wherein the wafer includes a back surface opposite the active surface, the active surface having a multiplicity of electrical contacts.

3. The method as recited in claim 2, further comprising dispensing a light blocking protective coating that covers at least a portion of the back surface of the wafer.

4. The method as recited in claim 3, wherein the light blocking protective coating and the light blocking filler material block infra-red light.

5. The method as recited in claim 3, wherein the light blocking protective coating and the light blocking filler material are opaque.

6. The method as recited in claim 3, wherein the light blocking protective coating and the light blocking filler material are formed from epoxy based materials.

7. The method as recited in claim 1, wherein the volume of the light blocking filler material dispensed into the channels substantially matches the volume of the channels.

8. The method as recited in claim 1, further comprising:
    curing the light blocking filler material such that the light blocking filler material attaches to the channels.

9. The method as recited in claim 1, wherein the light blocking filler material is applied to the channels in a manner that substantially eliminates air pockets within the light blocking material.

10. The method as recited in claim 1, wherein dispensing the light blocking filler material into the channels is performed such that the light blocking filler material does not overflow onto the active surface of the semiconductor wafer.

11. A wafer level method of packaging integrated circuits comprising:
    cutting a matrix of channels in a semiconductor wafer;
    dispensing a light blocking filler material into the channels; and
    dicing the semiconductor wafer by cutting the wafer along the channels and through the light blocking filler material, wherein the dicing cuts are narrower than the channels such that some of the light blocking filler material covers at least portions of side walls of the dice that are singulated by the dicing operation, wherein dispensing the light blocking filler material in the channels comprises:
    applying the light blocking filler material to a stamp, the stamp comprising:
        a base plate; and
        a multiplicity of spaced apart fins arranged in a matrix of lines that define a grid sized to match the spacing of the channels, each line of the matrix having a series of spaced apart fins; and
    aligning the stamp over the semiconductor wafer such that the fins are aligned with the channels, thereby allowing the light blocking filler material to dispense into the channels.

12. The method as recited in claim 11, wherein applying the light blocking filler material to the stamp comprises:
    submerging the fins into a dipping pan filled with the light blocking filler material such that a known volume of light blocking filler material is removed by the fins.

13. The method as recited in claim 11, wherein the dispensing step is performed such that the light blocking filler material does not cover an active surface of the semiconductor wafer.

* * * * *